United States Patent
Wu

(10) Patent No.: US 6,619,049 B1
(45) Date of Patent: Sep. 16, 2003

(54) METHOD FOR MANUFACTURING TEMPERATURE-MAINTAINING MATERIAL

(75) Inventor: Chieh-Jen Wu, Kao-Hsiung (TW)

(73) Assignee: Cheng Loong Corporation, Taipei Hsien ( * ) Notice: Subject to any disclaimer, the term of this patent is extended or adjusted under 35 U.S.C. 154(b) by 0 days.

(21) Appl. No.: 10/217,366

(22) Filed: Aug. 12, 2002

(51) Int. Cl.⁷ .................... B65B 63/08; F25D 3/08
(52) U.S. Cl. .................................. 62/60; 62/529
(58) Field of Search ................. 62/529, 60, 452; 252/67, 71

(56) References Cited

U.S. PATENT DOCUMENTS

| | | | | |
|---|---|---|---|---|
| 5,499,460 A | * | 3/1996 | Bryant et al. | 36/43 |
| 5,595,757 A | * | 1/1997 | Kiefer et al. | 424/451 |
| 5,851,338 A | * | 12/1998 | Pushaw | 156/278 |
| 6,099,894 A | * | 8/2000 | Holman | 427/126.3 |
| 6,514,362 B1 | * | 2/2003 | Zuckerman et al. | 156/79 |

* cited by examiner

Primary Examiner—Henry Bennett
Assistant Examiner—Malik N. Drake

(57) ABSTRACT

A method for manufacturing a temperature-maintaing material includes the steps of (1) selecting a phase-change substance, (2) processing the phase-change substance to form a liquid, (3) processing the phase-change substance with high molecule material to form microcapsules, (4) drying the microcapsules, (5) mixing the microcapsules with adhesive and hardening agent to form a mixture and (6) melting, cooling down and pulverizing the mixture for further processing to form a coating on an object or a substrate.

9 Claims, 7 Drawing Sheets

METHOD FOR MANUFACTURING TEMPERATURE-MAINTAINING MATERIAL

FIELD OF THE INVENTION

The present invention relates generally to a method for manufacturing a temperature-maintaining material comprised of phase-change substance encapsulated in microcapsules.

BACKGROUND OF THE INVENTION

A lot of electronic, electrical and mechanical devices generate heat during their operations. Often, the heat has significant influence on the devices themselves and the surroundings. With the improvement of the performance of the devices, the amount of heat generated is substantially increased. For example, some electrical motors generate a great amount of heat whereby the temperature may rise to above 100° C. Such a high temperature cannot be-effectively cooled down by simply employing the fan or heat sink based heat dissipation techniques and may consequently cause damage to parts of the devices and leading to malfunctioning. In addition, such a high temperature may cause physical damage to operators of the devices.

A well-known example of the heat-generating devices is a notebook computer. The notebook computer comprises a heat-conductive casing and heat generated during the operation of the notebook computer is conducted to the casing from which the heat radiates into the surrounding atmosphere. Thus, the efficiency for removing heat from the computer casing is of importance in maintaining proper operation thereof. The material that makes the computer casing is critical in this respect.

Materials that change phase when subject to heat are commonly employed to maintain temperature within a desired range. The phase-change substance that is encapsulated in microcapsules is widely used in different industries. For example and as shown in FIG. 1 of the attached drawings, small particles 11 of microcapsules of phase-change substance are mixed in a concrete or gypsum board 1 or a solar energy collection panel for temperature controlling purposes.

FIG. 2 of the attached drawings shows another application of the encapsulated phase-change substance. The small particles 11 of encapsulated phase-change substance are distributed and fixed in fabric 2 for temperature controlling purposes. Clothes made of such fabrics can maintain the temperature around a wearer within a desired temperature thereby making the wearer more comfortable.

It is thus desired to combine the encapsulated phase-change substance with the conventional heat dissipation techniques for improved temperature controlling purposes.

SUMMARY OF THE INVENTION

An object of the present invention is to provide a heat dissipation device made of a temperature-maintaining material comprising encapsulated phase-change substance for enhanced heat dissipation and temperature maintaining.

Another object of the present invention is to provide a temperature-maintaining material for controlling temperature of heat-generating devices, such as computers, motors and lightening devices, for extending the service lives of these devices.

To achieve the above objects, in accordance with the present invention, there is provided a method for manufacturing a temperature-maintaining material comprising the steps of (1) selecting a phase-change substance, (2) processing the phase-change substance to form a liquid, (3) processing the phase-change substance with high molecule material to form microcapsules, (4) drying the microcapsules, (5) mixing the microcapsules with adhesive and hardening agent to form a mixture and (6) melting, cooling down and pulverizing the mixture for further processing to form a coating on an object or a substrate.

BRIEF DESCRIPTION OF THE DRAWINGS

The present invention will be apparent to those skilled in the art by reading the following description of the best mode for carrying out the invention, with reference to the attached drawings, in which.

DETAILED DESCRIPTION OF THE INVENTION

Figure 1:
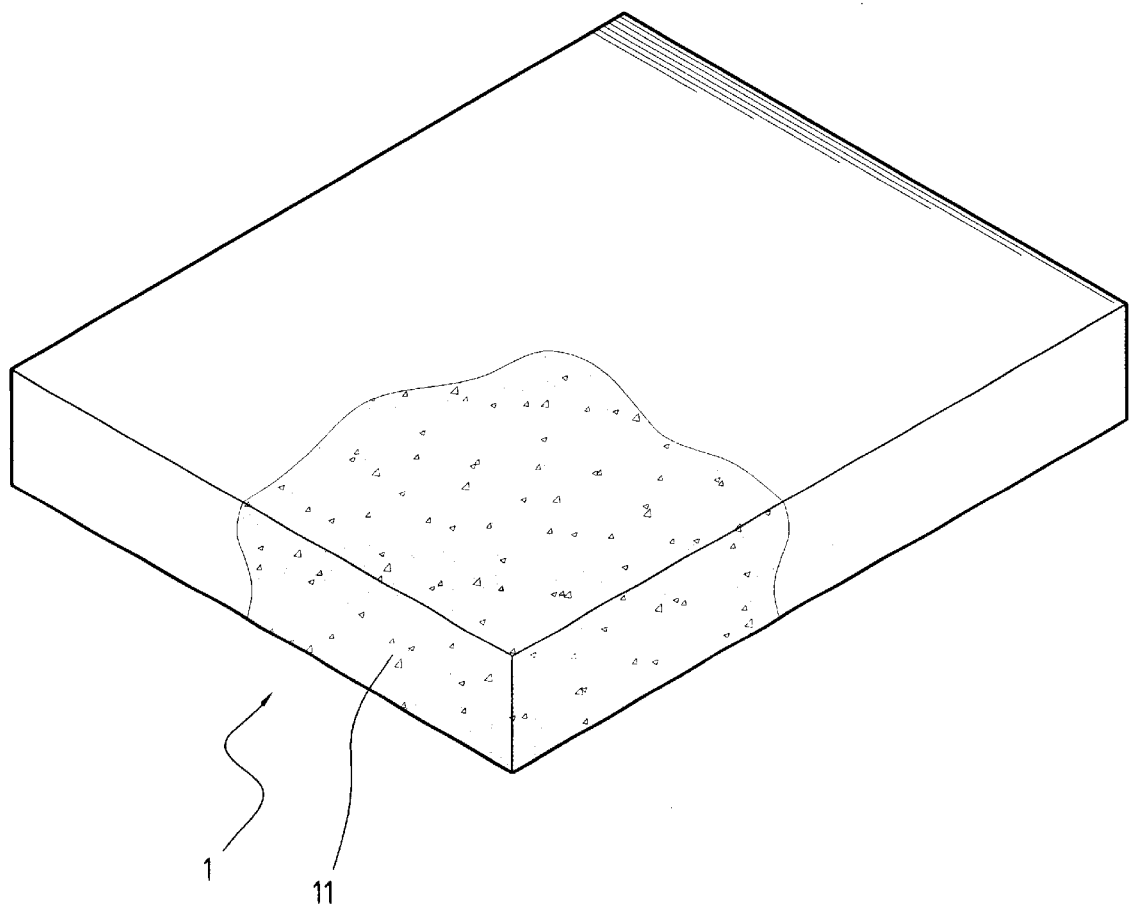
FIG. 1 is a perspective view showing a conventional application of the encapsulated phase-change substance.
Figure 2:
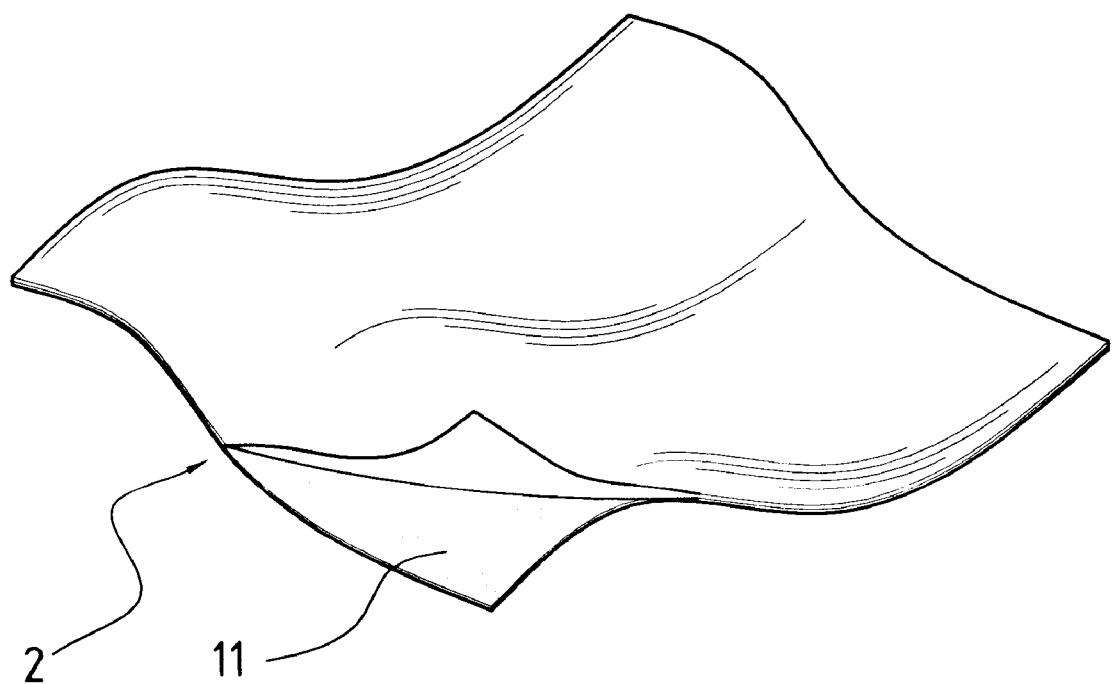
FIG. 2 is a perspective view showing another conventional application of the encapsulated phase-change substance.
Figure 3:
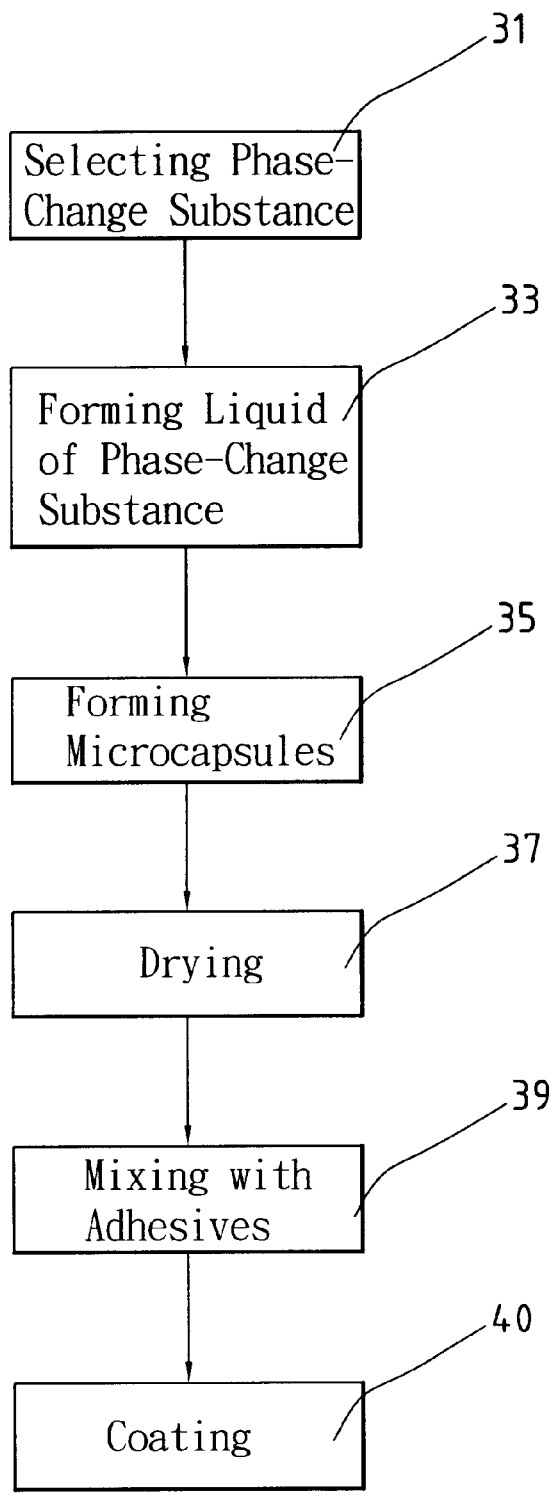
FIG. 3 is a flow chart of a method for manufacturing a temperature-maintaining material in accordance with the present invention that comprises encapsulated phase-change substance.

With reference to the drawings and in particular to FIG. 3, a method for manufacturing a temperature-maintaining material in accordance with the present invention comprises the following steps: First of all, one or more phase-change substances are selected (step 31). The phase-change substances are then molten (step 33) or otherwise processed to become liquid status and encased in microcapsules (step 35). The microcapsules are processed and dried (step 37) for further processing. The small particles of the microcapsules can be mixed with an adhesive matrix or a base material that comprises adhesives (step 39) thereby forming a temperature-maintaining material. If desired, hardening agents may be mixed with the adhesive matrix. The temperature-maintaining material can then be coated on any desired surface for temperature controlling purposes (step 40). If necessary, the temperature-maintaining material is melted, cooled down and pulverized for further coating operation.

The microcapsules of the present invention is made of the phase-change substance encased in small capsules made of high molecule materials, such as melamine formaldehyde resin, urea formaldehyde resin and polyurethane resin. The phase-change substances include straight chain alkanes, higher alcohol and organic acids, but are not limited to the substances mentioned above. Examples of the phase-change substances include eicosane, tetradecanol, hexadecanol, hexadecanoic acid and methyl hexadecanate.

In an illustrative example, a solution is prepared by dissolving melamine formaldehyde resin 27 parts in water 73 parts. Adding polyvinyl alcohol (20%) 2 parts in water 40 parts to form a second solution. The second solution is heated to 60° C. and then mixed with tetradecanol 5 parts. The mixture is processed and emulsified by a homogenizer for five minutes to form an emulsion. A reaction is taken place by adding the emulsion into the first solution made of melamine formaldehyde resin with added 1N hydrochloric acid to obtain a solution of PH=6. The reaction is conducted at a temperature of 60° C. for 1 hour. Once the reaction is completed, aqueous ammonia is added to the reaction product to make PH=9. When the temperature is lowered down to room temperature, the reaction product is filtered and dried to form the microcapsules that contain the phase-change substance in accordance with the present invention. Finally, 3 parts microcapsules obtained above are mixed with epoxy resin 7 parts and heated and molten together. The mixture is cooled down and pulverized and coated on for example a computer casing.

A test is conducted to verify the performance of the temperature-maintaining material made in accordance with the present invention. A simulation block for a computer central processing unit (CPU) is heated with 12 watts at an area of 9 mm×11 mm for simulation of a computer existing in an environmental temperature of 30° C. A comparison between samples with and without a coating of the temperature-maintaining material in accordance with the present invention is shown in the following table.

| Sample | A | B | C | D |
|---|---|---|---|---|
| Environmental temperature before heated (° C.) | 30 | 30 | 30 | 30 |
| Temperature of samples after heated (° C.) | 80 | 75 | 68 | 61 |
| Performance of heat removal | worse | bad | good | excellent |

Sample A is an aluminum plate, sample B an aluminum plate with two heat pipes, sample C an aluminum plate coated with the temperature-maintaining, material in accordance with the present invention and sample D an aluminum plate coated with the temperature-maintaining material of the present invention with additional heat pipes.

As can be noted from the table, samples C and D that are coated with the temperature-maintaining material of the present invention provide better performance than those conventional ones in removing heat.

The selection of the phase-change substances is based on the requirement of the applications thereof, such as computers, electronics, electrical appliances, motors, lightening devices and mechanical devices. The environmental temperature of the application is also a factor for selecting the phase-change substances. In other words, the phase change temperature of the phase-change substances is to be selected between the environmental temperature and the temperature of the heat-generating device whereby the phase-change substance is allowed to absorb heat from the heat-generating device thereby slowing down the increase of temperature of the heat-generating device. When the temperature of the phase-change substance does not reach the phase-change temperature of the substance, the phase-change substance is not saturated and the heat it absorbs is partly released to the environment to maintain the temperature of the phase-change substance substantially at or below the phase change temperature range. Heat exchange between the environment and the heat-generating device can thus be accomplished by the phase-change substance.

Figure 4:
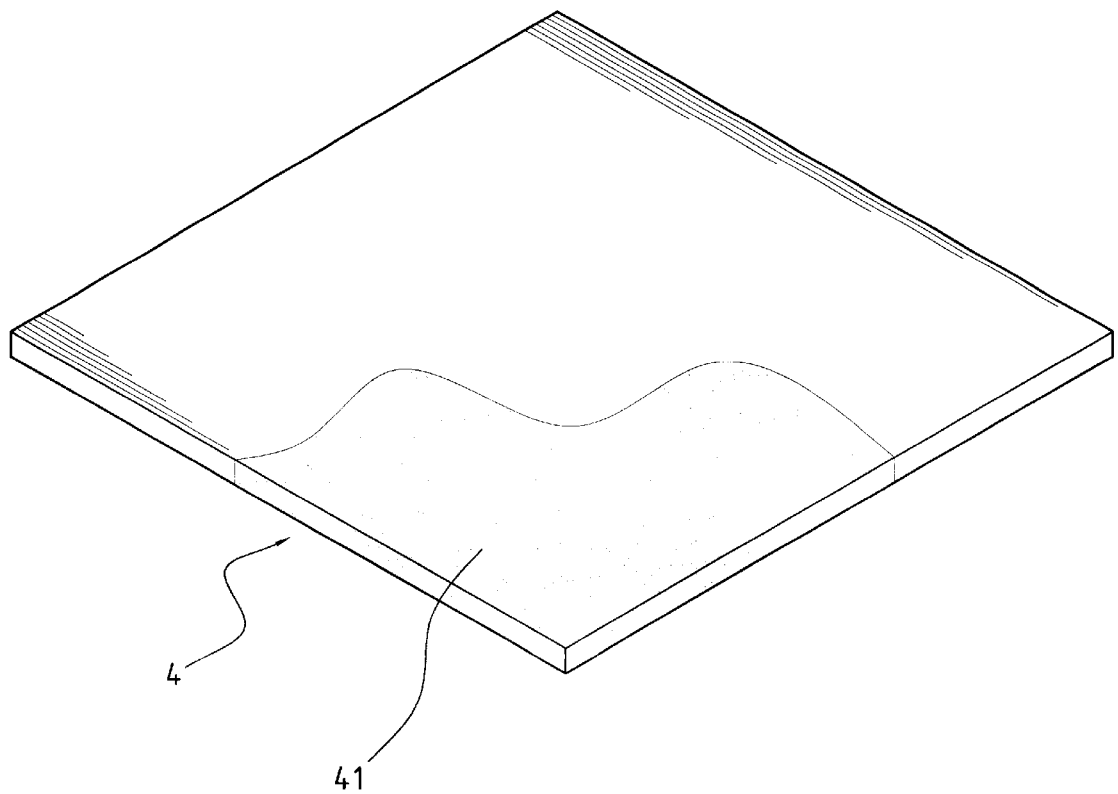
FIGS. 4–7 are perspective views showing different applications of the temperature-maintaining material made by the method of the present invention.
Figure 5:
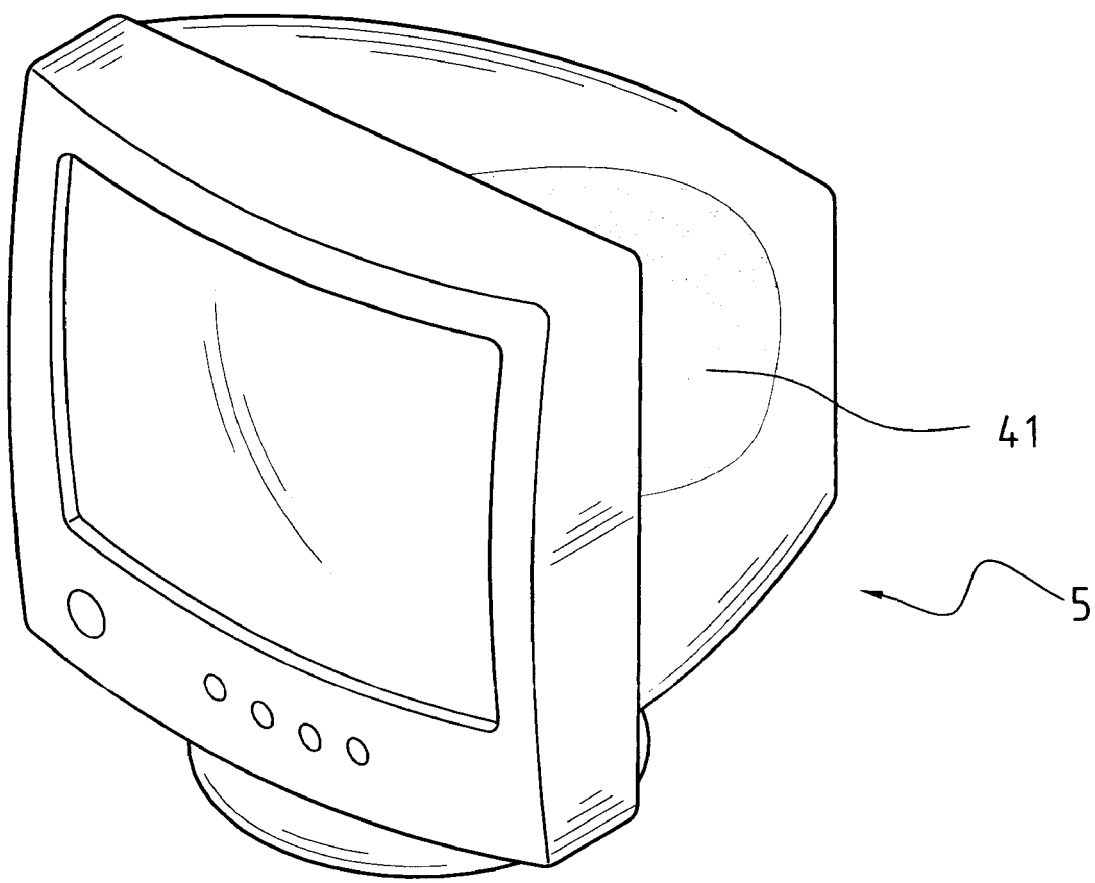
Figure 6:
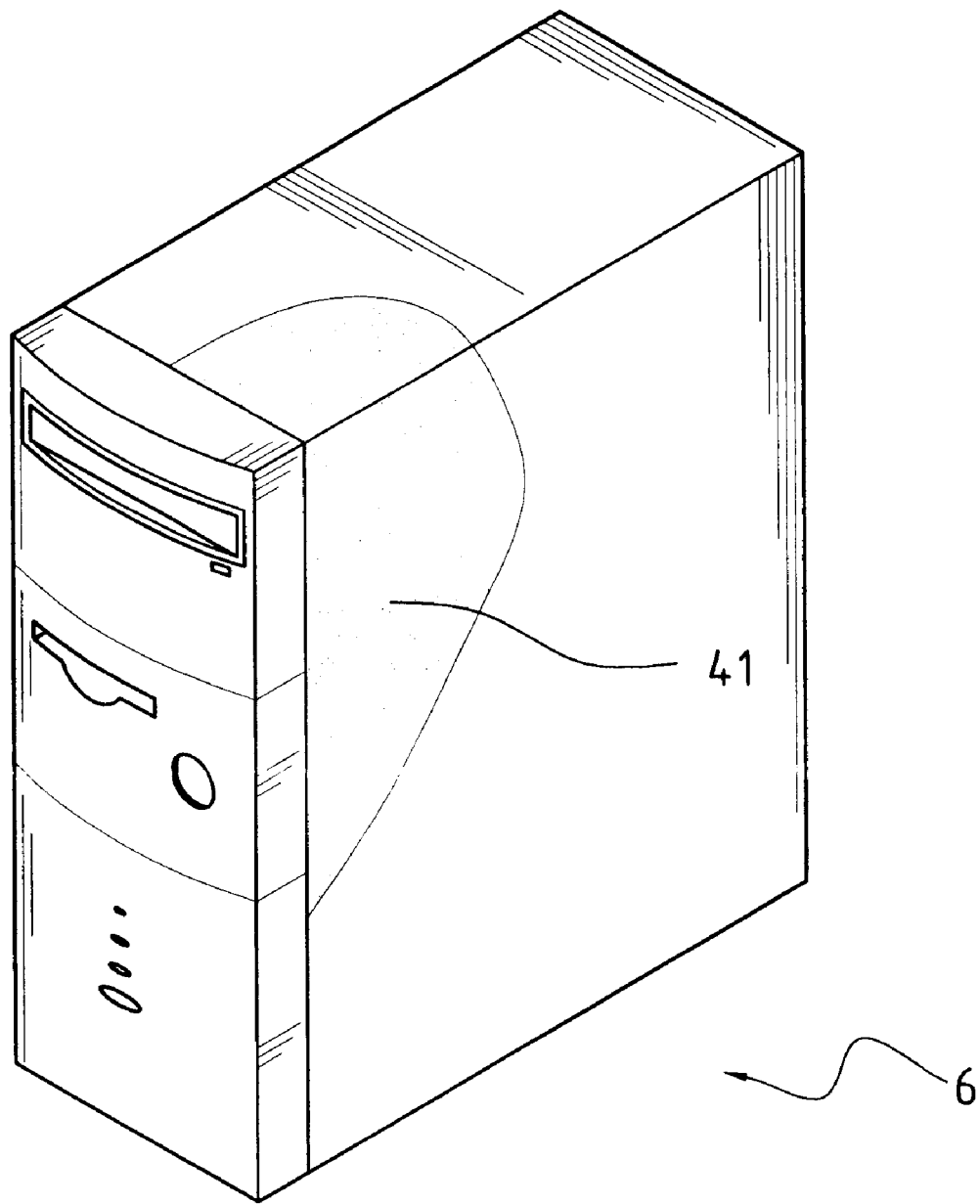
Figure 7:
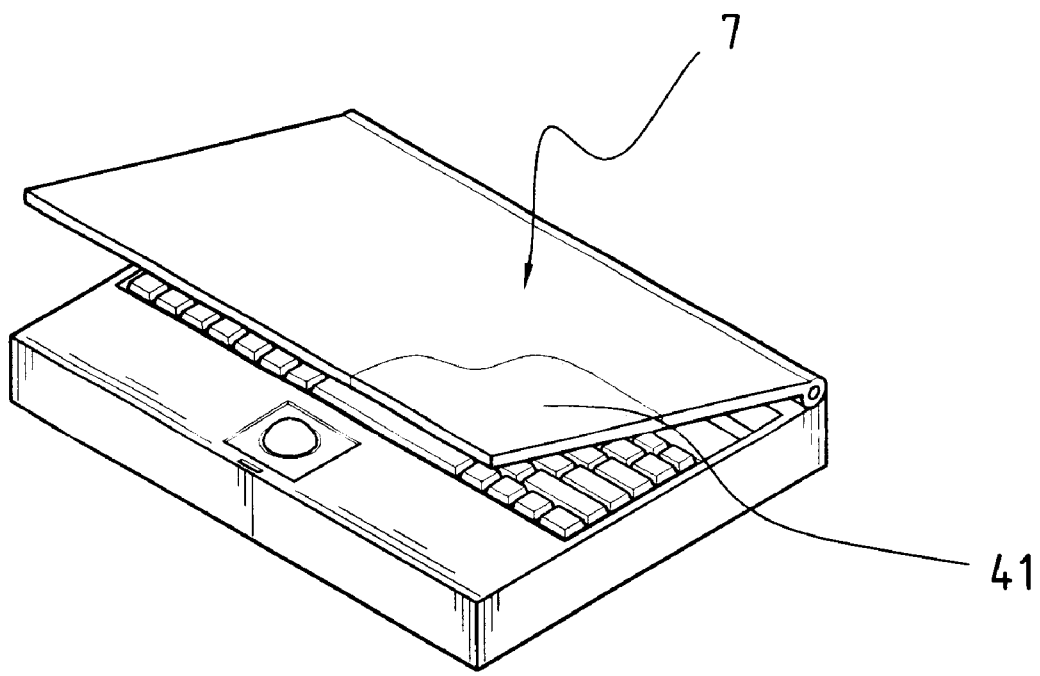

FIGS. 4–7 show different applications of the present invention. In FIG. 4, a board 4 having a coating 41 of the temperature-maintaining material of the present invention is shown. The board 4 can be incorporated in a device that continuously generates heat, such as a computer monitor casing 5 (FIG. 5), a desktop computer casing 6 (FIG. 6) and a notebook computer casing, 7 (FIG. 7), as well as other mechanical or electrical type heat-generating devices to remove heat and maintain the operation temperature of these devices.

Although the present invention has been described with reference to the best modes and examples thereof, it is apparent to those skilled in the art that a variety of modifications and changes may be made without departing from the scope of the present invention which is intended to be defined by the appended claims.

What is claimed is:

1. A method for manufacturing a temperature-maintaining material comprising the following steps:

(a) selecting a phase-change substance;

(b) processing the phase-change substance to form a liquid;

(c) processing the liquid to form microcapsules with high molecule material;

(d) drying the microcapsules;

(e) mixing the microcapsules with adhesives to form a mixture; and (f) melting the mixture, cooling down the mixture and pulverizing the mixture for further processing to form a coating on an object.

2. The method as claimed in claim 1, wherein in step (e), a hardening agent is added in the mixture.

3. The method as claimed in claim 1, wherein the phase-change substance is selected from a group comprising straight chain alkcanes, higher alcohol and organic acids.

4. The method as claimed in claim 1, wherein the phase-change substance is selected from a group comprising eicosane, tetradecanol, hexadecanol, hexadecanoic acid and methyl hexadecanate.

5. The method as claimed in claim 1, wherein the high molecule material is selected from a group comprising melamine formaldehyde resin, area formaldehyde resin and polyurethane resin.

6. A method for manufacturing a temperature-maintaining material comprising the following steps:

(a) selecting a phase-change substance;

(b) processing the phase-change substance to form a liquid;

(c) processing the liquid to form microcapsules with high molecule material;

(d) drying the microcapsules; and (e) mixing the microcapsules with adhesives to form a mixture;

wherein the high molecule material is selected from a group comprising melamine formaldehyde resin, urea formaldehyde resin and polyurethane resin.

7. The method as claimed in claim 6, wherein in step (e), a hardening agent is added in the mixture.

8. The method as claimed in claim 6, wherein the phase-change substance is selected from a group comprising straight chain alkanes, higher alcohol and organic acids.

9. The method as claimed in claim 6, wherein the phase-change substance is selected from a group comprising eicosane, tetradecanol, hexadecanol, hexadecanoic acid and methyl hexadecanate.

* * * * *